(12) United States Patent
Namkung et al.

(10) Patent No.: US 9,570,693 B2
(45) Date of Patent: Feb. 14, 2017

(54) DISPLAY DEVICE AND METHOD OF MANUFACTURING THE SAME

(71) Applicant: Samsung Display Co., Ltd., Yongin-si, Gyeonggi-do (KR)

(72) Inventors: Jun Namkung, Yongin-si (KR);
Kwang-Hyeok Kim, Yongin-si (KR);
Soon-Ryong Park, Yongin-si (KR);
Jung-Ho So, Yongin-si (KR);
Chul-Woo Jeong, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/886,338

(22) Filed: Oct. 19, 2015

(65) Prior Publication Data
US 2016/0043337 A1    Feb. 11, 2016

Related U.S. Application Data

(63) Continuation of application No. 14/726,357, filed on May 29, 2015, now Pat. No. 9,196,848, which is a
(Continued)

(30) Foreign Application Priority Data

Jul. 12, 2013    (KR) ........................ 10-2013-0081875

(51) Int. Cl.
*H01L 51/00* (2006.01)
*H01L 27/32* (2006.01)
*H01L 51/52* (2006.01)

(52) U.S. Cl.
CPC ......... *H01L 51/0097* (2013.01); *H01L 27/323* (2013.01); *H01L 27/3244* (2013.01); *H01L 51/5237* (2013.01); *H01L 51/5256* (2013.01); *H01L 27/3276* (2013.01); *H01L 2251/5338* (2013.01); *Y02E 10/549* (2013.01)

(58) Field of Classification Search
CPC ............. H01L 51/0097; H01L 51/5256; H01L 27/323; H01L 51/5237; H01L 27/3244; H01L 27/3276; H01L 2251/5338; Y02E 10/549
See application file for complete search history.

(56) References Cited

U.S. PATENT DOCUMENTS 9,196,848 B2 * 11/2015 Namkung ........... H01L 51/0097
2006/0170342 A1    8/2006 Kim et al.
(Continued)

FOREIGN PATENT DOCUMENTS

| KR | 10-2006-0059745 | 6/2006 |
| KR | 10-2006-0089977 | 8/2006 |
| KR | 10-2007-0055931 | 5/2007 |

*Primary Examiner* — Kyoung Lee
(74) *Attorney, Agent, or Firm* — Knobbe Martens Olson & Bear LLP

(57) ABSTRACT

A display device includes a display panel, a top member, and a bottom member. The top member is disposed on the display panel, and has a first groove region where at least a portion of an upper surface of the display panel is exposed. The bottom member is disposed under the display panel, and has a second groove region where at least a portion of a lower surface of the display panel is exposed. The first and second groove regions are located at a bending region of the display device.

23 Claims, 6 Drawing Sheets

Related U.S. Application Data continuation-in-part of application No. 14/138,892, filed on Dec. 23, 2013, now Pat. No. 9,048,443.

(56) References Cited

U.S. PATENT DOCUMENTS

| | | |
|---|---|---|
| 2009/0021666 A1 | 1/2009 | Chen |
| 2011/0050657 A1* | 3/2011 | Yamada .............. H01L 27/3293 345/204 |
| 2014/0042406 A1 | 2/2014 | Degner et al. |

* cited by examiner

DISPLAY DEVICE AND METHOD OF MANUFACTURING THE SAME

CROSS-REFERENCE TO RELATED APPLICATIONS

This application is a continuation of U.S. patent application Ser. No. 14/726,357, filed on May 29, 2015, which is a continuation in part of U.S. patent application Ser. No. 14/138,892, filed on Dec. 23, 2013, issued as U.S. Pat. No. 9,048,443 on Jun. 15, 2015, which claims priority under 35 U.S.C. §119 to Korean Patent Application No. 10-2013-0081875 filed on Jul. 12, 2013, the disclosures of which are incorporated by reference herein in their entireties.

BACKGROUND

Field

Example embodiments relate to a display device and a method of manufacturing the display device.

Description of the Related Technology

A flexible active matrix organic light emitting diode (AMOLED) display device includes a display region and a peripheral region. The display region is a region displaying an image, and the peripheral region (which may be referred to as a dead space) includes wirings and a circuit unit of the display device. Recently, various methods have been developed to minimize the peripheral region of the display device. However, reducing the peripheral region of the display device in two dimensions is limited.

SUMMARY OF CERTAIN INVENTIVE ASPECTS

Example embodiments provide a display device capable of reducing a peripheral region.

Example embodiments also provide a method of manufacturing a display device capable of reducing a peripheral region.

According to one aspect of example embodiments, a display device includes a display panel, a top member, and a bottom member. The top member is disposed on the display panel, and has a first groove region where at least a portion of an upper surface of the display panel is exposed. The bottom member is disposed under the display panel, and has a second groove region where at least a portion of a lower surface of the display panel is exposed. The first and second groove regions are located at a bending region of the display device.

The first and second groove regions may be formed by laser irradiation.

A neutral plane at the bending region of the display device may be formed between the upper surface of the display panel and the lower surface of the display panel.

The top member may include at least one selected from a polarizer, a touch screen panel or a plastic window.

The bottom member may include at least one bottom film.

The display panel may include a first substrate on the bottom member, a light emitting structure on the first substrate, and a second substrate on the light emitting structure.

The first substrate may have flexible materials.

The second substrate may have a stack structure where at least one inorganic layer and at least one organic layer are alternately stacked.

The display device and the method of manufacturing the display device according to example embodiments can readily bend a portion of the display device by having the groove region, and thus can reduce a peripheral region by bending the peripheral region.

BRIEF DESCRIPTION OF THE DRAWINGS

Example embodiments can be understood in more detail from the following description taken in conjunction with the accompanying drawings, in which.

DETAILED DESCRIPTION OF CERTAIN INVENTIVE EMBODIMENTS

Figure 1:
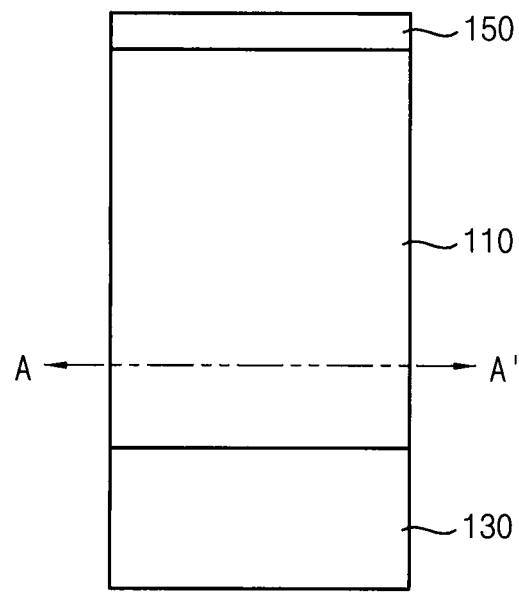
FIG. 1 is a plane view illustrating a display device in accordance with example embodiments.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals generally refer to like or similar elements throughout. As used herein, the term "and/or" includes any and all combinations of one or more of the associated listed items.

It will be understood that, although the terms first, second, third, and the like may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "below" or "beneath" other elements or features would then be oriented "above" the other elements or features. Thus, the example term "below" can encompass both an orientation of above and below. The apparatus may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of an apparatus and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

To reduce the peripheral region of display devices in three dimensions, a method of bending or folding the peripheral region has been developed. However, it is not easy to manufacture a display panel that is bendable or foldable. For example, since a top side of the display panel includes a polarizer, a touch panel, a window, or the like, and a bottom side of the display panel may include a bottom protection film, or the like, the display panel has a large thickness, and the thick display panel may not be readily bent or folded.

FIG. 1 is a plane view illustrating a display device in accordance with example embodiments.

Referring to FIG. 1, a display device may include a display unit 110, a pad unit 130 and a peripheral unit 150.

The display unit 110 may be surrounded by the pad unit 130 and the peripheral unit 150. The display unit 110 may include a display panel, and may display an image. For example, the display unit 110 may include a polarizer, a thin film encapsulation (TFE) substrate, an organic light emitting layer, a flexible substrate, a double polyimide (PI) film, a bottom film, or the like.

The pad unit 130 may be formed at a lower region of the display device. The pad unit 130 may be electrically connected to the display unit 110. The pad unit 130 may generate an image signal to the display unit 110, and the display unit 110 may display an image based on the image signal. For example, the pad unit 130 may include a data driving circuit, a printed circuit board, and the like. The peripheral unit 150 may be formed at least at an upper region of the display device. The peripheral unit 150 may be electrically connected to the display unit 110 and pad unit 130, and may transfer the image signal from the pad unit 130 to the display unit 110. For example, the peripheral unit 150 may include a data line to transfer the image signal. The peripheral unit 150 may further include a power line, an on/off switch line, a reference line, a gate driving circuit, and the like.

In addition, the peripheral unit 150 may be further formed at both side portions of the display device. The display device may be bent such that the peripheral unit 150 at both side portions of the display device is disposed on a lower surface of the display device, and thus the peripheral unit 150 at both side portions of the display device may not be viewable when the display device is viewed from a top side.

Figure 2:
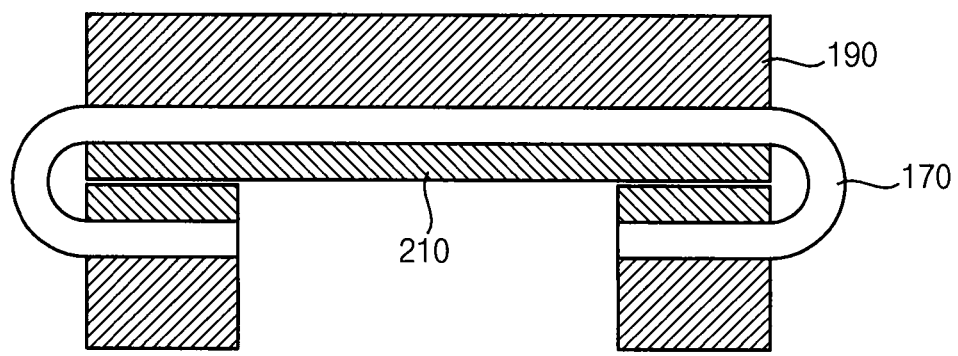
FIG. 2 is a cross-sectional view illustrating a display device taken along a line A-A' in FIG. 1 in accordance with example embodiments.

FIG. 2 is a cross-sectional view illustrating a display device taken along a line A-A' in FIG. 1 in accordance with example embodiments, and FIGS. 3A to 3D are cross-sectional views for describing a method of manufacturing a display device in accordance with example embodiments.

Figure 3A:
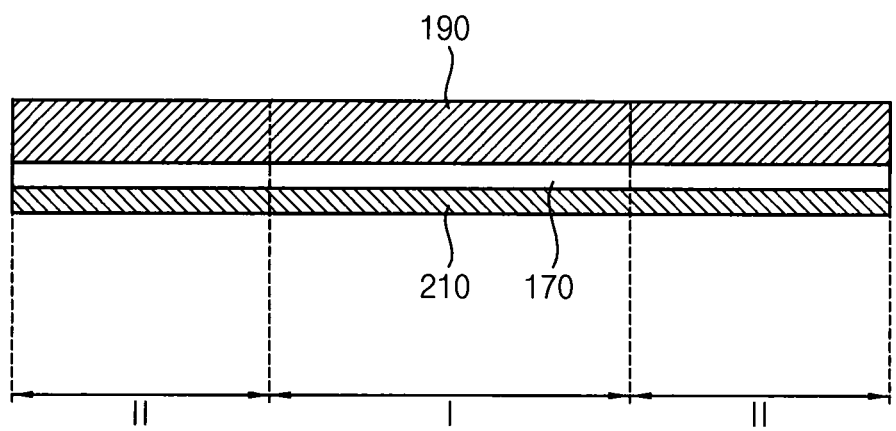
FIGS. 3A through 3D are cross-sectional views for describing a method of manufacturing a display device in accordance with example embodiments.
Figure 3B:
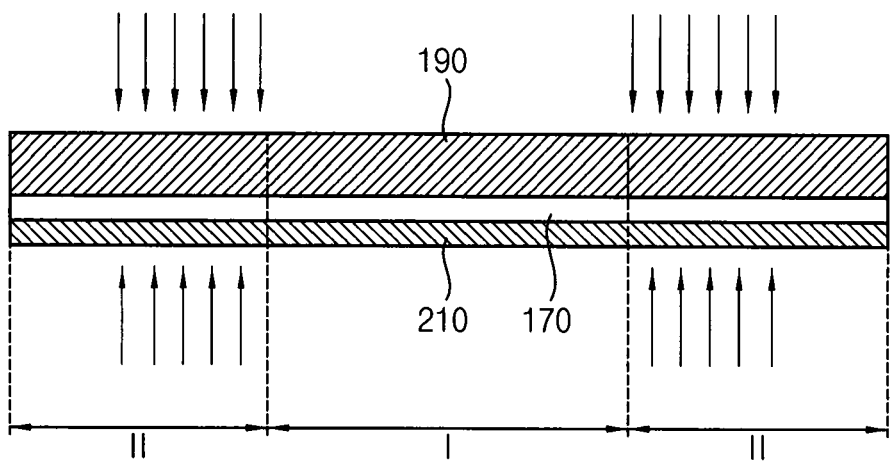
Figure 3C:
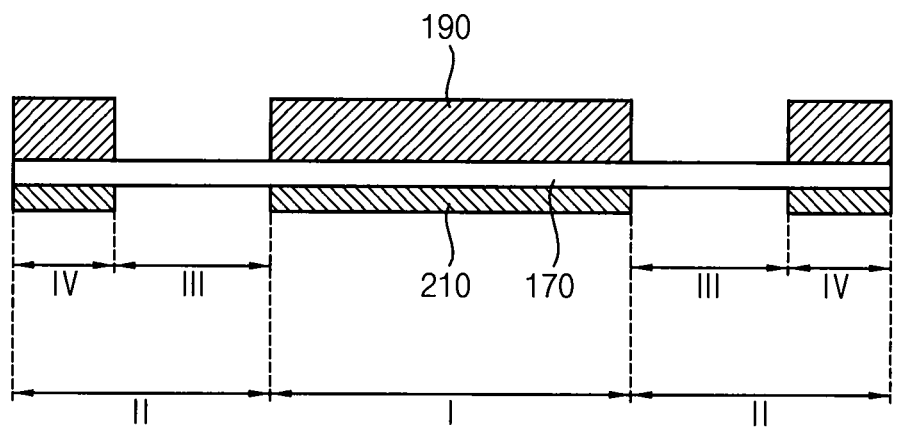
Figure 3D:
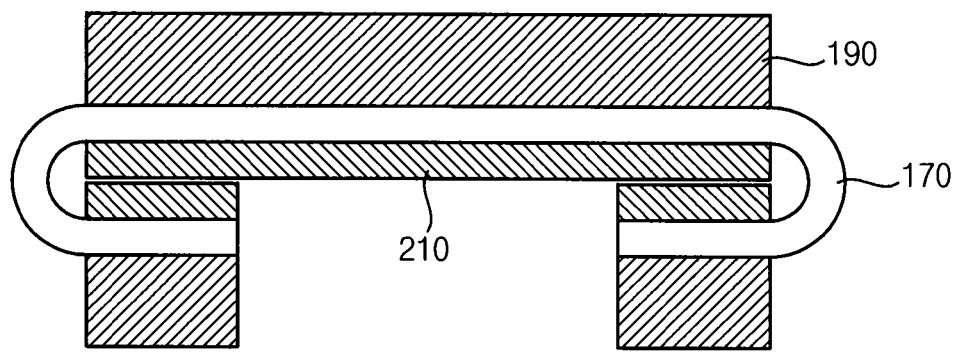

Referring to FIGS. 2 through 3D, a display device 100 may include a bottom member 210, a display panel 170 and a top member 190.

The bottom member 210 may include a double PI film, a bottom film pressure sensitive adhesive (PSA) and a bottom film polyethylene terephthalate (PET). The double PI film of the bottom member 210 may be disposed on a lower surface of the display panel 170 to protect the lower surface of the display panel 170. In some example embodiments, a thickness of the double PI film may be about 21 µm. For example, the double PI film may include a barrier having a thickness of about 1 µm, a top PI having a thickness of about 10 µm, and a bottom PI having a thickness of about 10 µm. In some example embodiments, the top PI may be used as a flexible substrate. In this case, the bottom member may include the barrier and the bottom PI. The double PI film may include a polyimide. The bottom film PSA of the bottom member 210 may be disposed between the double PI film and the bottom film PET such that the double PI film and the bottom film PET adhere to each other. In some example embodiments, a thickness of the bottom film PSA may be about 25 µm. For example, the bottom film PSA may include a urethane-based material, an acryl-based material, a silicon-based material, or the like.

The bottom film PET may be disposed on a lower surface of the bottom film PSA to protect the display panel 170. In some example embodiments, a thickness of the bottom film PET may be about 75 µm. For example, the bottom film PET may include polyethylene terephthalate (PET), polyethylene naphthalate (PEN), polypropylene (PP), polycarbonate (PC), polystyrene (PS), polysulfone (PSul), polyethyene (PE), polyphthalamide (PPA), polyethersulfone (PES), polyarylate (PAR), polycarbonate oxide (PCO), modified polyphenylene oxide (MPPO), or the like.

The display panel 170 may be disposed on the bottom member 210. The display panel 170 may include a bottom substrate (e.g., a first substrate), an organic light emitting layer, a top substrate (e.g., a second substrate), and the like. The organic light emitting layer that generates light may be disposed between the bottom substrate and the top substrate. In some example embodiments, a thickness of the bottom substrate on which the organic light emitting layer is formed may be about 7.7 µm, and a thickness of the top substrate may be about 6.6 µm. For example, the bottom substrate may include a flexible substrate, and the top substrate may include a thin film encapsulation (TFE) substrate. Here, the TFE substrate may have a stack structure where at least one inorganic layer and at least one organic layer are alternately stacked, and the TFE substrate may be combined with the flexible substrate.

The top member 190 may be disposed on the display panel 170. The top member 190 may include a polarizer (POL), a touch screen panel (TSP), a plastic window, or the like. For example, the TSP may be disposed on the POL, and the plastic window may be disposed on the TSP. The POL may include polyvinyl acetate (PVA)-based resin film, and the TSP may include indium tin oxide (ITO), zinc oxide (ZnO), graphene, silver (Ag) nanowire (AgNW), copper (Cu), or the like. The plastic window may include a plastic-based material having transparency of more than about 95%. In some example embodiments, the top member 190 may include the POL having a thickness of about 153 µm. A length of the POL may be shorter than a length of the display panel 170.

The display device 100 may display an image at a display region I, and a peripheral region II surrounding the display region I may not display the image. The peripheral region II may include a power line of the display device 100, an on/off switch line, a reference line, a gate diving circuit, or the like.

A groove region III may be formed at a bending region where the display device 100 is bent or folded. The groove region III may be formed by removing at least one of the top member 190 and the bottom member 210 at the bending region of the display device 100. For example, the groove region III may be formed by irradiating laser to at least one of the top member 190 and the bottom member 210 at the bending region of the display device 100. In some example embodiments, the groove region III may include a first groove where the top member 190 is removed at the bending region of the display device 100, and a second groove where the bottom member 210 is removed at the bending region of the display device 100. In some example embodiments, the laser may be generated by a CO2 laser source having high energy efficiency. In some example embodiments, a length of the groove region III may be about 300 µm to about 16 mm.

In a conventional display device having no groove region III, a neutral plane (NP) (of which a length remains constant although the display device is bent or folded) that is not under stress (either compression or tension) may be formed outside the display panel (for example, in the bottom member) when the display device is bent or folded. In this case, if the display device is bent, the display panel may be damaged (for example, broken). However, the display device 100 according to example embodiments may include the groove region III where at least one of the top member 190 and the bottom member 210 is removed at the bending region of the display device 100, and thus a neutral plane may be formed in the display panel 170. Accordingly, the display panel 170 may not be damaged, and the display device may be readily bent or folded. In some example embodiments, as illustrated in FIG. 2, the bending region where the display device is bent may have a half circle shape. For example, a radius of the half circle may be about 0.15 mm to about 8 mm.

When an object is bent, a plane that is neither increased nor decreased in cross-sectional size may be referred to as the neutral plane of the object. In a case where the object comprises the same material, the neutral plane may correspond to a midplane of the object. Otherwise, when the object comprises at least two materials (such as, for example, a composite material), the neutral plane may be different from the midplane of the object. In a conventional display device having no groove region III, the neutral plane of the display device may be in the bottom member. However, in the display device 100 according to example embodiments, the groove region III may be formed at the bending region of the display device 100 to change the neutral plane. If the groove region III is formed at the bending region, the neutral plane at the bending region of the display device 100 may be formed between an upper surface of the display panel 170 and a lower surface of the display panel 170. Accordingly, since the neutral plane is formed inside the display panel 170, the display panel 170 may not be damaged, and the display device 100 according to example embodiments may be readily bent or folded.

A contact region IV may be formed in the outside of the groove region III. The contact region IV may include a portion of the top member 190, a portion of the display panel 170 and a portion of the bottom member 210. When the display device 100 is bent, the contact region IV may be contacted with the lower surface of the bottom member 210.

Referring to FIG. 3A, the display panel 170 may be formed on the bottom member 210, and the top member 190 may be disposed on the display panel 170. The display device 100 may include the display region I and the peripheral region II.

Referring to FIG. 3B, laser may be irradiated to a portion of the peripheral region II of the display device 100. The laser irradiation may remove at least one of the bottom member 210 and the top member 190 at the portion of the peripheral region II, or at the bending region. In some example embodiments, as illustrated in FIG. 3B, the laser may be irradiated to both of the top member 190 and the bottom member 210.

Referring to FIG. 3C, the groove region III may be formed in the portion the peripheral region II, or the bending region, and the contact region IV may be formed in the outside of the groove region III. The groove region III may include a portion of the display panel 170. In some example embodiments, a length of the groove region III may be about 300 µm to about 16 mm.

Referring to FIG. 3D, after the display device 100 is bent, and the contact region IV is disposed on the lower surface of the bottom member 210. The bending region where the display device 100 is bent may have a half circle shape. In some example embodiments, a radius of the half circle may be about 0.15 mm to about 8 mm. The bottom member 210 at the contact region IV may be contact with the bottom member 210 at the display region I.

As described above, since the display device 100 includes the groove region III at the bending region, the display device 100 according to example embodiments may be readily bent or folded. Further, in the display device 100 according to example embodiments, the peripheral region II may be disposed on the lower surface of the display device 100 by bending the groove region III, and thus a dead space (e.g., the non-display region or the peripheral region) may be disposed on the bottom member 210 of the display device 100. Accordingly, the front side of the display device 100 may have a dead space free structure.

Figure 4:
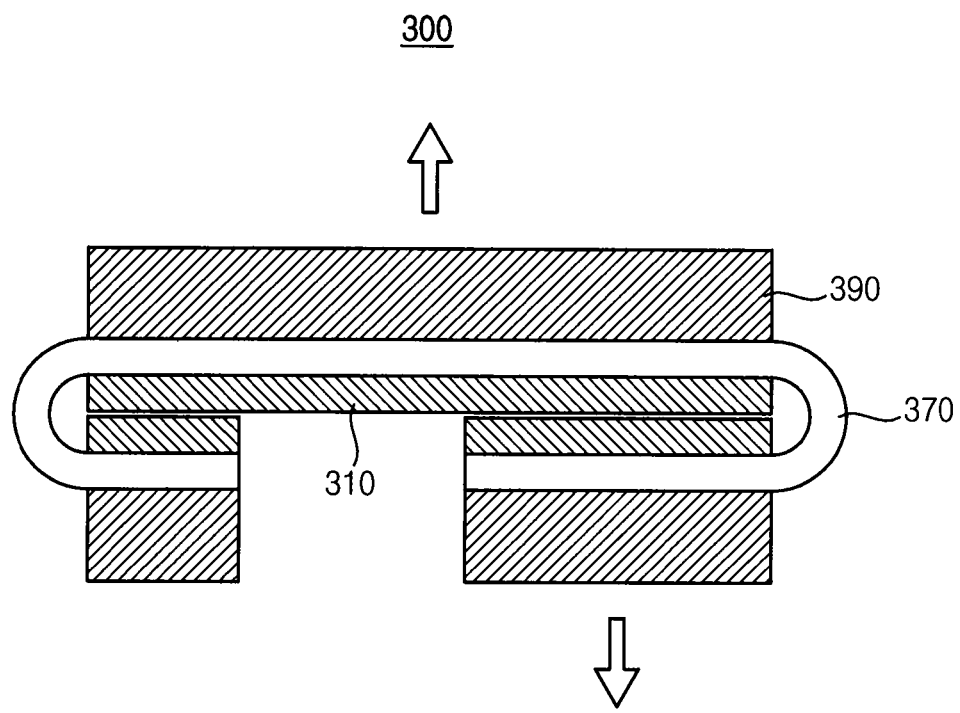
FIG. 4 is a cross-sectional view illustrating a display device in accordance with example embodiments.

FIG. 4 is a cross-sectional view illustrating a display device in accordance with example embodiments, and FIGS. 5A through 5D is a cross-sectional view a method of manufacturing a display device in accordance with example embodiments.

Figure 5A:
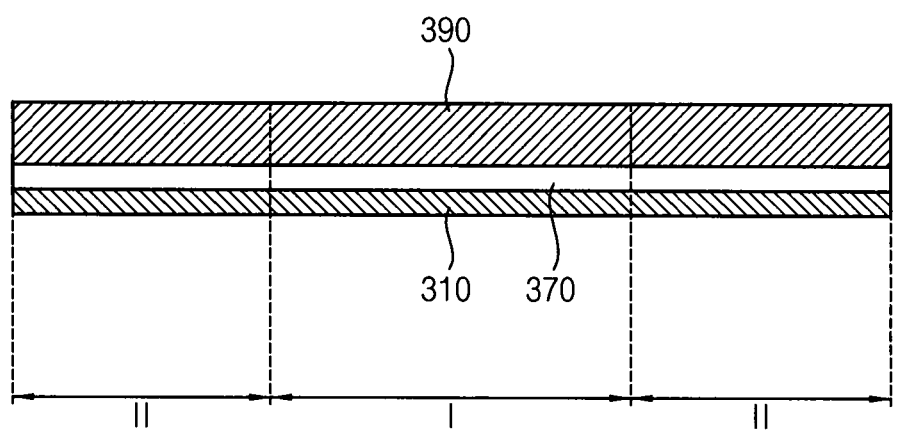
FIGS. 5A through 5D are cross-sectional views for describing a method of manufacturing a display device in accordance with example embodiments.
Figure 5B:
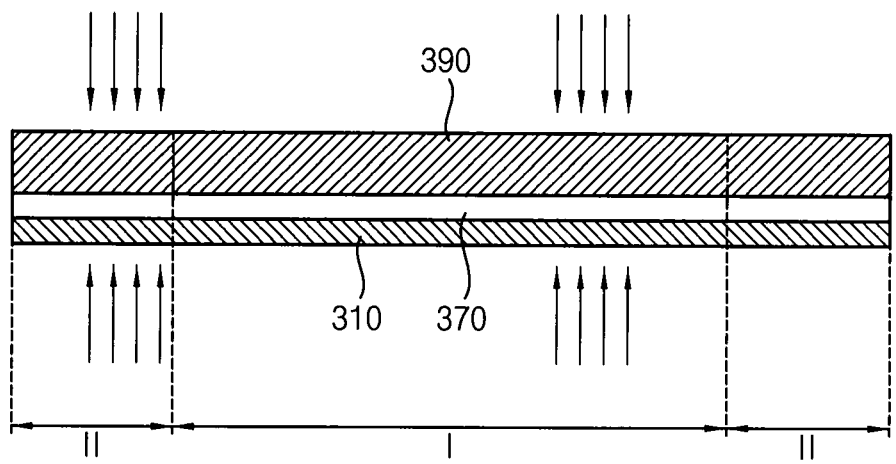
Figure 5C:
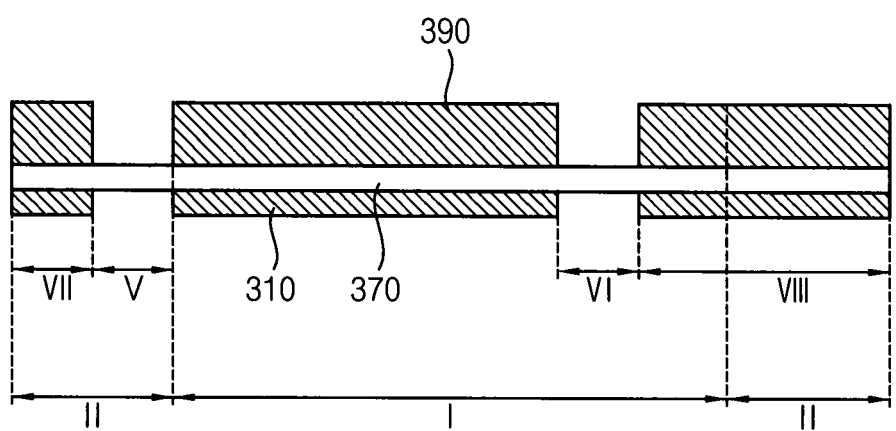
Figure 5D:
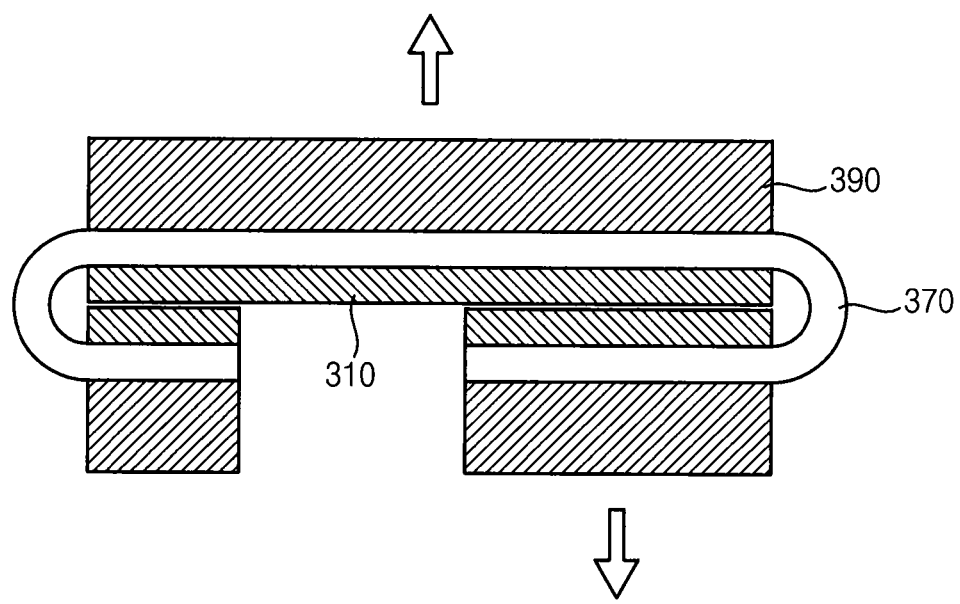

Referring FIG. 4 through 5D, a display device 300 may include a bottom member 310, a display panel 370 and a top member 390.

The bottom member 310 may include a double polyimide (PI) film, a bottom film pressure sensitive adhesive (PSA) and a bottom film polyethylene terephthalate (PET). The double PI film of the bottom member 310 may be disposed on a lower surface of the display panel 370, to protect the lower surface of the display panel 370. In some example embodiments, a thickness of the double PI film may be about 21 μm. For example, the double PI film may include a barrier having a thickness of about 1 μm, a top PI having a thickness of about 10 μm and a bottom PI having a thickness of about 10 μm. In some example embodiments, the top PI may be used as a flexible substrate. In this case, the bottom member may include the barrier and the bottom PI. The double PI film may include a polyimide. The bottom film PSA of the bottom member 310 may be disposed between the double PI film and the bottom film PET such that the double PI film and the bottom film PET adhere to each other. In some example embodiments, a thickness of the bottom film PSA may be about 25 μm. For example, the bottom film PSA may include a urethane-based material, an acryl-based material, a silicon-based material, and the like.

The bottom film PET may be disposed on a lower surface of the bottom film PSA, to protect the display panel 170. In some example embodiments, a thickness of the bottom film PET may be about 75 μm. For example, the bottom film PET may include polyethylene terephthalate (PET), polyethylene naphthalate (PEN), polypropylene (PP), polycarbonate (PC), polystyrene (PS), polysulfone (PSul), polyethyene (PE), polyphthalamide (PPA), polyethersulfone (PES), polyarylate (PAR), polycarbonate oxide (PCO), modified polyphenylene oxide (MPPO), or the like.

The display panel 370 may be disposed on the bottom member 310. The display panel 370 may include a bottom substrate, an organic light emitting layer, a top substrate, and the like. The organic light emitting layer that generates light may be disposed between the bottom substrate and the top substrate. In some example embodiments, a thickness of the bottom substrate on which the organic light emitting layer is formed may be about 7.7 μm, and a thickness of the top substrate may be about 6.6 μm. For example, the bottom substrate may include a flexible substrate, and the top substrate may include a thin film encapsulation (TFE) substrate. Here, the TFE substrate may have a stack structure where at least one inorganic layer and at least one organic layer are alternately stacked, and the TFE substrate may be combined with the flexible substrate.

The top member 390 may be disposed on the display panel 370. The top member 390 may include a polarizer (POL), a touch screen panel (TSP), a plastic window, or the like. For example, the TSP may be disposed on the POL, and the plastic window may be disposed on the TSP. The POL may include polyvinyl acetate (PVA)-based resin film, and the TSP may include indium tin oxide (ITO), zinc oxide (ZnO), graphene, silver (Ag) nanowire (AgNW), copper (Cu), or the like. The plastic window may include a plastic-based material having transparency of more than about 95%. In some example embodiments, the top member 390 may include the POL having a thickness of about 153 μm. A length of the POL may be shorter than a length of the display panel 370.

The display device 300 may display an image at a display region I, and a peripheral region II surrounding the display region I may not display the image. The peripheral region II may include a power line of the display device 300, an on/off switch line, a reference line, a gate diving circuit, and the like.

The first groove region V and the second groove region VI may be formed at a bending region where the display device 300 is bent or folded. The first groove region V and the second groove region VI may be formed by removing at least one of the top member 390 and the bottom member 310 at the bending region of the display device 300. For example, the first groove region V and the second groove region VI may be formed by irradiating laser to at least one of the top member 390 and the bottom member 310 at the bending region of the display device 300. In some example embodiments, a first groove is where the top member 390 is removed at the bending region of the display device 300 and a second groove is where the bottom member 310 is removed at the bending region of the display device 300. In some example embodiments, the laser may be generated by a CO2 laser source having high energy efficiency. In some example embodiments, a length of the first groove region V and the second groove region VI may be about 300 μm to about 16 mm.

In a conventional display device having no the first groove region V and the second groove region VI, a neutral plane (NP) (of which a length remains constant although the display device is bent or folded) that is not under stress (either compression or tension) may be formed outside the display panel (for example, in the bottom member) when the display device is bent or folded. In this case, if the display device is bent, the display panel may be damaged (for example, broken). However, the display device 300 according to example embodiments may include the first groove region V and the second groove region VI where at least one of the top member 390 and the bottom member 310 is removed at the bending region of the display device 300, and thus a neutral plane may be formed in the display panel 370. Accordingly, the display panel 370 may not be damaged, and the display device may be readily bent or folded. In some example embodiments, as illustrated in FIG. 4, the bending region where the display device is bent may have a half circle shape. For example, a radius of the half circle may be about 0.15 mm to about 8 mm.

When an object is bent, a plane that is neither increased nor decreased in cross-sectional size may be referred to as the neutral plane of the object. In a case where the object comprises the same material, the neutral plane may correspond to a midplane of the object. Otherwise, when the object comprises at least two materials (such as, for example, a composite material), the neutral plane may be different from the midplane of the object. In a conventional display device not having the first groove region V and the second groove region VI, the neutral plane of the display device may be in the bottom member. However, in the display device 300 according to example embodiments, the first groove region V and the second groove region VI may be formed at the bending region of the display device 300 to change the neutral plane. If the first groove region V and the second groove region VI are formed at the bending region, the neutral plane at the bending region of the display device 300 may be formed between an upper surface of the display panel 370 and a lower surface of the display panel 370. Accordingly, since the neutral plane is formed inside the display panel 370, the display panel 370 may not be damaged, and the display device 300 according to example embodiments may be readily bent or folded.

A contact region VII, VIII may be formed in the outside of the first groove region V and the second groove region VI. The contact region VII, VIII may include a portion of the top member 390, a portion of the display panel 370 and a portion of the bottom member 310. When the display device 300 is bent, the contact region VII, VIII may be contacted with the lower surface of the bottom member 310.

Referring to FIG. 5A, the display panel 370 may be formed on the bottom member 310, and the top member 390 may be disposed on the display panel 370. The display device 300 may include the display region I and the peripheral region II.

Referring to FIG. 5B, laser may be irradiated to a portion of peripheral region II of the display device 300. The laser irradiation may remove at least one of the bottom member 310 and the top member 390 at the portion of the peripheral region II, or at the bending region. In some example embodiments, as illustrated in FIG. 5B, the laser may be irradiated to both of the top member 390 and the bottom member 310.

Referring to FIG. 5C, the first groove region V may be formed in the portion of the peripheral region II, or the bending region, and the second groove region VI may be formed in the portion of the display region I or the bending region. The contact region VII, VIII may be formed in the outside of the first groove region V and the second groove region VI. The first groove region V and the contact region VII may be included in the peripheral region II. Otherwise, the second groove region VI and the contact region VIII may include the portion of the peripheral region II and the display region I. The first groove region V and the second groove region VI may include a portion of the display panel 370. In some example embodiments, a length of the first groove region V and the second groove region VI may be about 300 µm to about 16 mm.

Referring to FIG. 5D, after the display device 300 is bent, the contact region VII, VIII is disposed on the lower surface of the bottom member 310. The bending region where the display device 300 is bent may have a half circle shape. In some example embodiments, a radius of the half circle may be about 0.15 mm to about 8 mm. The bottom member 310 at the contact region VII may be contact with the bottom member 310 at the display region I. In addition, the bottom member 310 of the contact region VIII may be in contact with the bottom member 310 of the display region I. However, the contact region VIII may include a portion of the display region I. Thus, a back side of the display device 300 may include the portion of the display region I, and may display an image by the display region I. Another portion of the display region I may display the image toward the front side of the display device 300. In some example embodiments, when the contact region VII, VIII may include the portion of the display region I, both side portions of the back side of the display device 300 may be displayed. Another region of the display region I may display the image toward the front side where the display device 300 displays the image.

As described above, since the display device 300 includes the first groove region V and the second groove region VI at the bending region, the display device 300 according to example embodiments may be readily bent or folded. Further, in the display device 300 according to example embodiments, the peripheral region II may be disposed on the lower surface of the display device 300 by bending the first groove region V and the second groove region VI, and thus a dead space (e.g., the non-display region or the peripheral region) may be disposed on the bottom member 310 of the display device 300. Accordingly, the front side of the display device 300 may have a dead space free structure.

Figure 6:
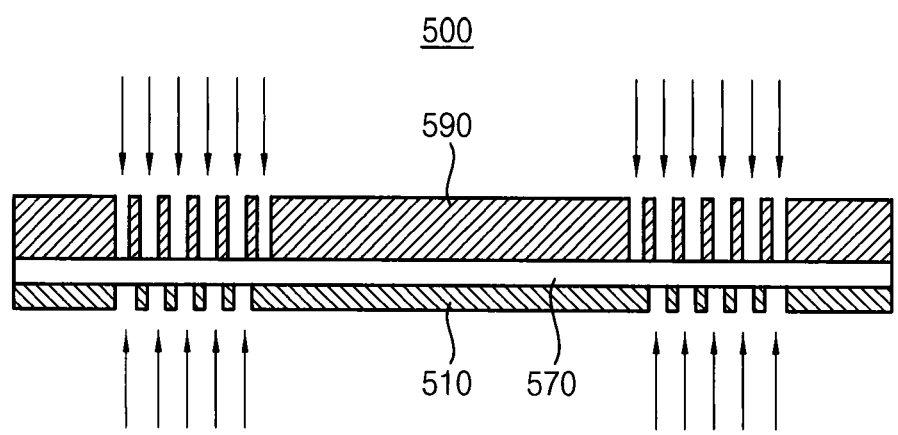
FIG. 6 is a cross-sectional view illustrating a display device in accordance with example embodiments.

FIG. 6 is a cross-sectional view illustrating a display device in accordance with example embodiments.

Referring to FIG. 6, a display device 500 may include a bottom member 510, a display panel 570 and a top member 590.

The above display device 500 may be substantially similar to the display device 100 described with reference to FIG. 2. Thus, the structure of the display device 100 is explained in FIG. 2. Further repetitive explanation concerning the above elements will be omitted. In addition, the method of manufacturing the display device 500 may be substantially similar to a method of manufacturing the display device 100 described with reference to FIG. 3A to 3D. However, when laser is irradiated to the display device 500, a portion of the bottom member 510 or the top member 590 on the display panel 570 may be removed. In particular, a plurality of the first grooves where the top member 590 is removed may be formed by spacing apart from each other in the portion of the display panel 570 which is bent, and a plurality of the second grooves where the bottom member 510 is removed may be formed by spacing apart from each other in the portion of the display panel 570 which is bent.

The present embodiments may be applied to any electronic device having a display device. For example, embodiments may be applied to mobile phones, smart phones, laptop computers, tablet computers, personal digital assistants (PDAs), portable multimedia players (PMPs), digital cameras, music players, portable game consoles, navigation devices, or the like.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A display device, comprising:
    a display panel having a display region and a peripheral region surrounding the display region;
    a top member on the display panel, the top member having first and second groove regions that are parallel to each other, when viewed in a plan view of the display device; and
    a bottom member under the display panel,
    wherein the first and second groove regions are located at first and second bending regions of the display device, respectively.

2. The display device of claim 1, wherein the bottom member has third and fourth groove regions that are corresponding to the first and second groove regions, respectively, and the third and fourth groove regions are located at the first and second bending regions of the display device, respectively.

3. The display device of claim 2, wherein each of the first, second, third, and fourth groove regions is formed by laser irradiation.

4. The display device of claim 2, wherein the first and third groove regions overlap the first bending region, and the second and fourth groove regions overlap the second bending region.

5. The display device of claim 4, wherein the top member is disposed in each of the first and second bending regions where the first, second, third, and fourth groove regions are located.

6. The display device of claim 4, wherein an upper surface of the display panel is exposed in each of the first and second bending regions where the first, second, third, and fourth groove regions are located.

7. The display device of claim 4, wherein each of the first and second bending regions is located in the peripheral region.

8. The display device of claim 7, wherein the display device is bent at the first and second bending regions such that a portion of the peripheral region that is located in the outside of each of the first and second bending regions is disposed on a bottom surface of the bottom member.

9. The display device of claim 4, wherein the first bending region is located in the peripheral region, and the second bending region is located in the display region.

10. The display device of claim 9, wherein the display device is bent at the first bending region such that a portion of the peripheral region that is located in the outside of the first bending region is disposed on a first portion of a bottom surface of the bottom member, and wherein the display device is bent at the second bending region such that a portion of the display region and the peripheral region that are located in the outside of the second bending region is disposed on a second portion of a bottom surface of the bottom member.

11. The display device of claim 10, wherein a portion of the display region disposed on the second portion of a bottom surface of the bottom member displays an image toward a back side of the display device, and a remaining portion of the display region displays an image toward a front side of the display device.

12. The display device of claim 1, wherein the display panel includes a data line, a power line, an on/off switch line, a reference line, a gate driving circuit, and the lines and the gate driving circuit are located in the peripheral region.

13. The display device of claim 1, wherein the top member is disposed in the display region and the peripheral region on the display panel.

14. The display device of claim 1, wherein a neutral plane at the bending region of the display device is formed between an upper surface of the display panel and a lower surface of the display panel.

15. The display device of claim 1, wherein the top member includes at least one selected from a polarizer, a touch screen panel or a plastic window.

16. A display device, comprising:
a display panel having a display region and a peripheral region surrounding the display region;
a top member on the display panel, the top member exposing at least a portion of the display panel that is located in the peripheral region; and
a bottom member under the display panel, the bottom member having an opening exposing at least a portion of the display panel,
wherein the opening is located at a bending region of the display device.

17. The display device of claim 16, wherein the bending regions is located in the peripheral region.

18. A display device, comprising:
a display panel having a display region and a peripheral region surrounding the display region;
a top member on the display panel, the top member exposing at least a portion of the display panel that is located in the peripheral region; and
a bottom member under the display panel, the bottom member having a groove that is located in at least a portion of the display panel,
wherein the groove is located at a bending region of the display device.

19. The display device of claim 18, wherein the bending regions is located in the peripheral region.

20. A display device, comprising:
a display panel having a display region and a peripheral region surrounding the display region;
a top member on the display panel, the top member covering the display panel that is located in the display region and only a portion of the display panel that is located in the peripheral region; and
a bottom member under the display panel, the bottom member having an opening exposing at least a portion of the display panel,
wherein the opening is located at a bending region of the display device.

21. The display device of claim 20, wherein the bending regions is located in the peripheral region.

22. A display device, comprising:
a display panel having a display region and a peripheral region surrounding the display region;
a top member on the display panel, the top member covering the display panel that is located in the display region and only a portion of the display panel that is located in the peripheral region; and
a bottom member under the display panel, the bottom member having a groove that is located in at least a portion of the display panel,
wherein the groove is located at a bending region of the display device.

23. The display device of claim 22, wherein the bending regions is located in the peripheral region.

* * * * *